United States Patent
Richardson

(10) Patent No.: US 6,617,889 B1
(45) Date of Patent: Sep. 9, 2003

(54) SIGNAL AMPLITUDE COMPARATOR

(75) Inventor: Kenneth G. Richardson, Erie, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/156,963

(22) Filed: May 29, 2002

(51) Int. Cl.[7] .......................... H03K 5/153; H03K 5/22
(52) U.S. Cl. ........................ 327/77; 327/82; 327/89
(58) Field of Search ........................ 327/77–81, 83, 327/85, 88, 89, 359, 361, 362

(56) References Cited

U.S. PATENT DOCUMENTS

| | | | | |
|---|---|---|---|---|
| 4,931,797 A | * | 6/1990 | Kagawa et al. | 341/162 |
| 6,064,240 A | * | 5/2000 | Wachter | 29/407.08 |
| 6,229,350 B1 | * | 5/2001 | Ricon-Mora | 327/77 |
| 6,448,821 B1 | * | 9/2002 | Sakurai | 327/56 |

* cited by examiner

Primary Examiner—Tuan T. Lam
(74) Attorney, Agent, or Firm—Trexler, Bushnell, Giangiorgi, Blackstone & Marr Ltd.

(57) ABSTRACT

A signal amplitude comparator which includes a first differential input circuit that is biased, is configured to receive an input voltage and is configured to generate a first output current that is a non-linear function of the input voltage, a second differential input circuit which is biased similarly to the first differential input circuit, is configured to receive a reference input voltage and is configured to generate a second output current that generally tracks process, temperature and supply variation, and a comparator which is connected to the first differential input circuit and the second differential input circuit and is configured to receive the first output current from the first differential input circuit and the second output current from the second differential input circuit. The comparator is configured to compare the first and second output currents and generate an output which indicates whether the input voltage exceeds a predetermined threshold value.

20 Claims, 3 Drawing Sheets

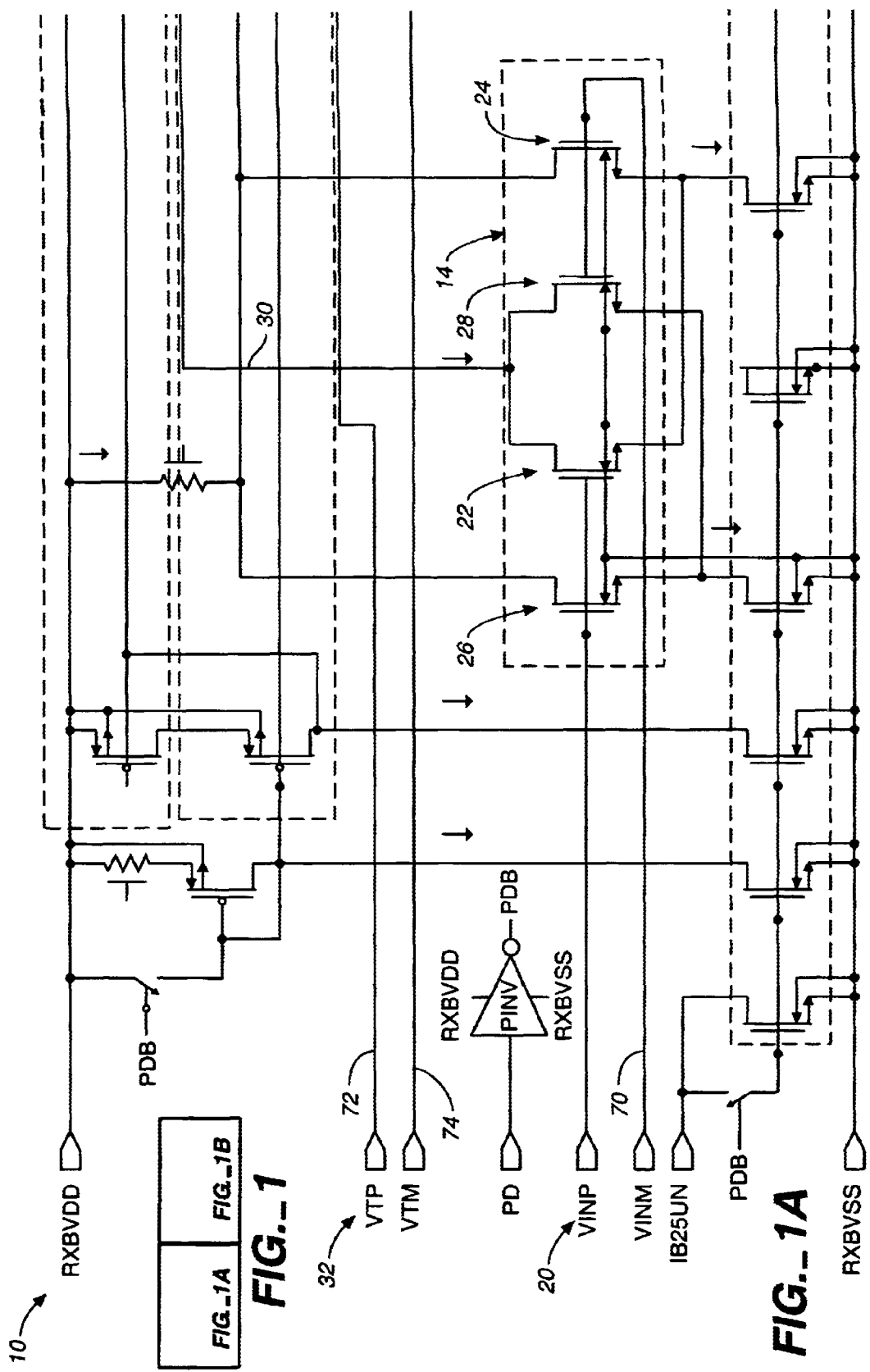

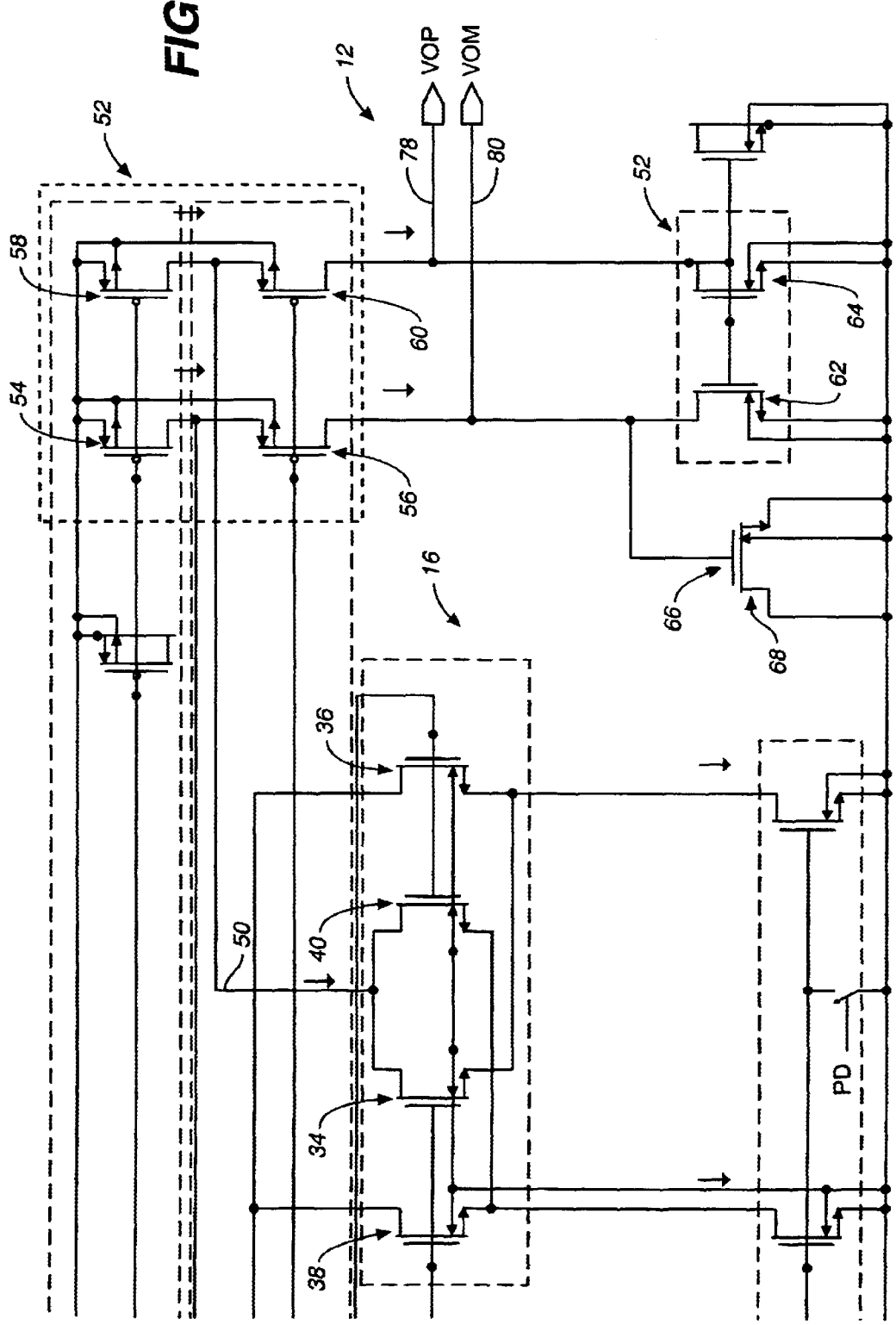
FIG._1B

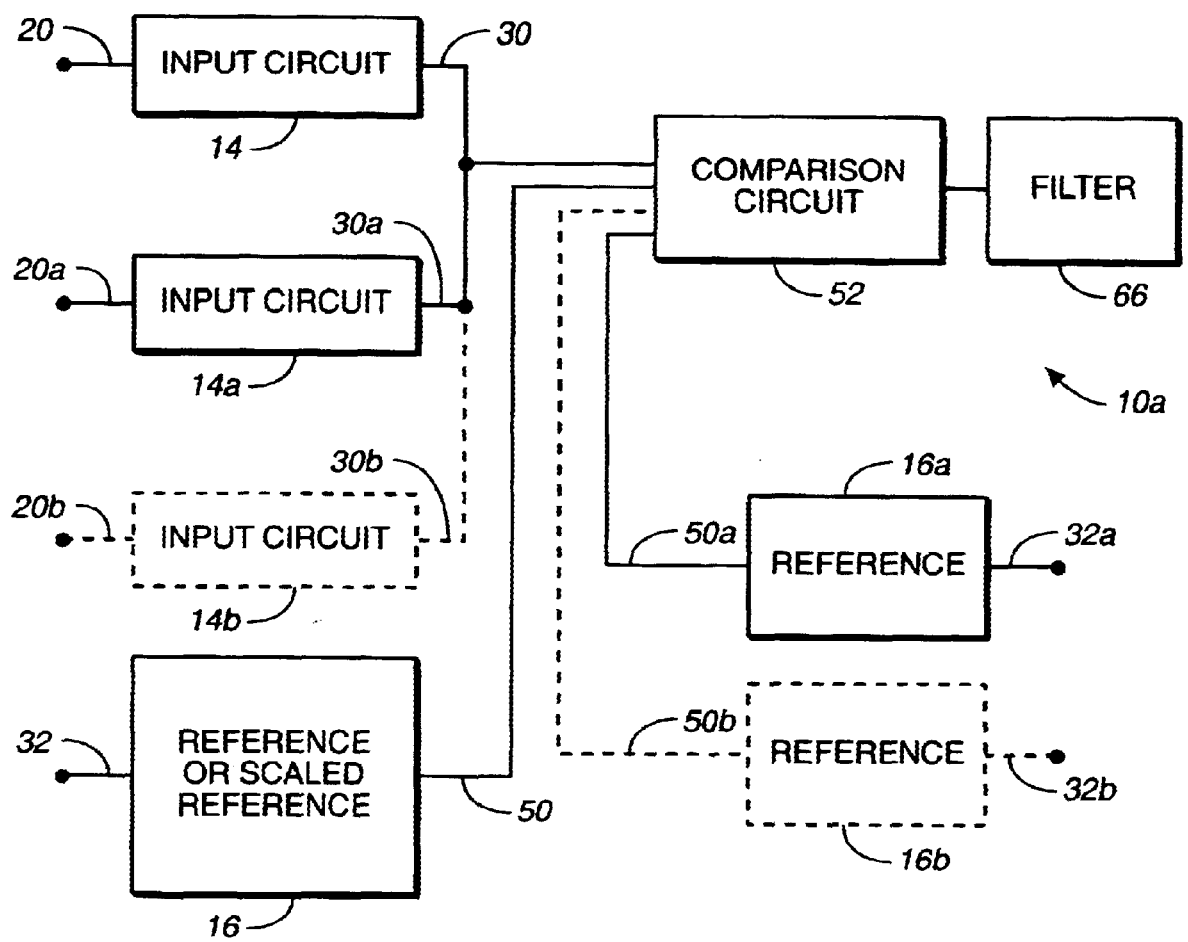
FIG._2
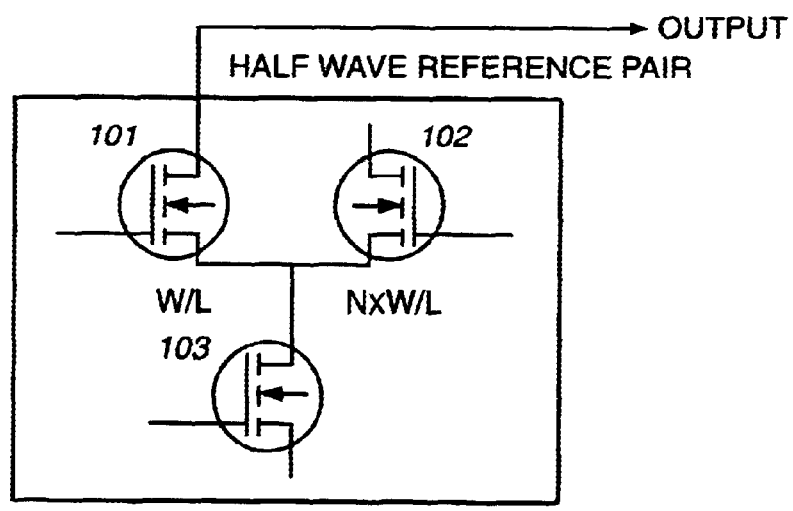
FIG._3

SIGNAL AMPLITUDE COMPARATOR

BACKGROUND

The present invention generally relates to methods and devices for detecting the presence or absence of high frequency signals in a system, and more specifically relates to a signal amplitude comparator.

There are numerous methods to detect the presence or absence of high frequency signals in a system. When the signal is primarily of alternating current, at frequencies where it is somewhat difficult to generate gain in a given semiconductor process, at a signal swing that is small compared to the Vt of the device and power is limited, the task becomes more difficult.

Dual differencing amplifiers have been applied to signal processing and comparison tasks with good success. However, at high frequencies, it is difficult to get good performance.

Square law operation of MOS transistors can generate good signal levels at high frequencies for signal detection. The presence of the direct current term as a result of product detection has an average value that can be constant over a wide range of frequencies. However, typical process variation makes it difficult to get a repeatable threshold value.

OBJECTS AND SUMMARY

A general object of an embodiment of the present invention is to provide a signal amplitude comparator which is configured to generate an output that accurately determines presence of a signal with a repeatable amount of amplitude.

Another object of an embodiment of the present invention is to provide a differential input circuit that is configured to generate an output current that is a non-linear function of an input voltage, and is configured to produce even order harmonic distortion over an input voltage range of interest.

Briefly, and in accordance with at least one of the forgoing objects, an embodiment of the present invention provides a signal amplitude comparator which includes a first differential input circuit that is biased, is configured to receive an input voltage and is configured to generate a first output current that is a non-linear function of the input voltage, a second differential input circuit which is biased similarly to the first differential input circuit, is configured to receive a reference input voltage and is configured to generate a second output current that generally tracks process, temperature and supply variation, and a comparator which is connected to the first differential input circuit and the second differential input circuit and is configured to receive the first output current from the first differential input circuit and the second output current from the second differential input circuit. The comparator is configured to compare the first and second output currents and generate an output which indicates whether the input voltage exceeds a predetermined threshold value.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 1 is a schematic drawing of a signal amplitude comparator which is in accordance with an embodiment of the present invention;

FIG. 2 is a block diagram of a full-wave poly-phase signal amplitude comparator which is in accordance with an embodiment of the present invention; and FIG. 3 is a block diagram of a poly-phase signal amplitude comparator which is in accordance with an embodiment of the present invention.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 1 illustrates a signal amplitude comparator 10 which is in accordance with an embodiment of the present invention. Many aspects of what is shown in FIG. 1 would be readily understood by one having ordinary skill in the art while reviewing FIG. 1. Those aspects of FIG. 1 which directly relate to the present invention are described hereinbelow. The signal amplitude comparator 10 is configured to generate an output 12 that accurately determines presence of a signal with a repeatable amount of amplitude.

The signal amplitude comparator 10 includes a first differential input circuit 14 and a second differential input circuit 16 which is effectively a replica of the first differential input circuit 14. Each differential input circuit consists of a pair of input circuits. Specifically, the first differential input circuit 14 is configured to receive an input voltage 20, and consists of two asymmetrical differential transistor pairs, a first pair which consists of transistor 22 and 24, wherein transistor 24 is biased so that it is in saturation for all signal levels where an accurate comparison is required. Transistors 26 and 28 form an opposing, second coupled transistor pair which is biased in an identical matter. The drains of transistors 22 and 28 are connected together and form the output 30 of the first differential input circuit 14. All input and reference devices are built from multiple legs of width W/L; best practices for device matching should be followed.

The first differential input circuit 14 is configured to generate an output current that is a non-linear function of the input voltage. The width ratio of 24 to 22 set by the ratio of the number of legs, determines the non-linearity of the transfer function; if 24 is much, much wider than 22, the transfer function will approach the natural transfer function of the device, which in the case of a FET, will be square-law. For smaller width ratios, a more linear transfer function is given. It is expected that, for most cases, a ratio of 8:1 will work well. While higher ratios will generally provide better performance, higher ratios also generally require greater power levels. Smaller ratios tend to be more linear, and this reduces the output signal level.

The second differential input circuit 16 is configured to receive a reference input voltage 32 which may be a direct current voltage source or an alternating current voltage source. Like the first differential input circuit 14, the second differential input circuit 16 consists of two asymmetrical differential transistor pairs. A first pair consists of transistors 34 and 36, wherein transistor 36 is biased so that it is in saturation for all signal levels expected. Transistors 38 and 40 form an opposing, second coupled transistor pair which is biased in an identical matter. The drains of transistors 34 and 40 are connected together and form the output 50 of the second differential input circuit 16. The output 50 is a current that generally tracks process, temperature and supply variation.

In addition to the first differential input circuit 14 and second differential input circuit 16, the signal amplitude comparator 10 includes a comparator or comparison circuit 52 which is connected to the first differential input circuit 14 and second differential input circuit 16. The comparator 52 is configured to receive the outputs 30, 50 from the first differential input circuit 14 and second differential input circuit 16 and compare the signals to determine whether the input voltage 20 exceeds a pre-determined threshold value. As shown, the comparator 52 may consist of a plurality of transistors 54, 56, 58, 60, 62 and 64. The signal amplitude comparator 10 also preferably includes a filter or filtering circuit 66 which consists of a transistor 68.

The signal amplitude comparator 10 can be configured such that the first differential input circuit 14 generates an output current 30 that is a non-linear function of the input voltage 20 and produces even order harmonic distortion over the input voltage range of interest.

Input capacitance is primarily related to the size of transistors 22 and 28. The other transistors in the differential input circuit 14, i.e., transistors 24 and 26, act primarily as source followers and do not contribute, relative to their size, to the input capacitance. Offset performance is a function of the size of the smaller device as well. Each process has a different sensitivity to offsets, so the devices must be scaled accordingly.

When the average current through transistor 22 and 28, summed, exceeds the current 50 from the reference pair, the difference in the voltage at the output 12, VOP (78 in FIG. 1)–VOM (80 in FIG. 1), will become positive indicating that the signal has exceeded the threshold. The signal amplitude comparator 10 can use an alternating current voltage as well as a direct current voltage for a reference 32. If the reference and measured signal voltages have similar waveshapes, the accuracy with respect to the reference signal will be very good. If, as in the case for the actual application, the waveforms do not match, it can only be determined that the input has met the threshold based on the waveshape which are expected.

As shown in FIG. 1, transistor 22 is connected common-source to transistor 24. In operation, the common source connection tends to track the VINM input (70) but offset by a Vt. Since transistor 22 IS Much smaller than transistor 24, the current in transistor 22 can vary considerably without upsetting the operation of transistor 24. As a result, transistor 22 operates primarily as a square law device generating an output current that varies with VINP (72) minus VINM (74) squared up to the point where transistor 22 gets cut-off. This does not generally affect the circuit operation. Since the signal shape of the crest-factor is known, a suitable threshold voltage (such as a direct current voltage) may be selected. It is preferable that oppositely connected signal path input differential pairs be used, so at the time one side gets cut-off, the other side is generating a strong squared signal.

The reference differential pair 16 is configured to generate an output current that tracks the process, temperature and supply variation. So, for example, if k-prime drops due to a higher on-chip temperature, the output 50 from the reference 16 drops also moving the actual reference back to the same relative place it was.

The two currents 30 and 50 are compared in the output stage and filtered by filter 66. When the input signal pair 14 generates a current 30 that exceeds the reference current, the output voltage difference VOP (78) minus VOM (80) goes positive indicating that the signal has crossed the threshold.

FIG. 2 illustrates a poly-phase signal amplitude comparator 10a which is similar to that which is shown in FIG. 1, and is in accordance with an embodiment of the present invention. As shown in FIG. 2, the poly-phase signal amplitude comparator 10a includes an input circuit 14, a reference circuit or scaled reference circuit 16, a comparison circuit 52 and a filter 66 much like the signal amplitude comparator 10 shown in FIG. 1. However, as shown in FIG. 2, the poly-phase signal amplitude comparator 10a includes an additional input circuit 14a (or two additional input circuits 14a and 14b (shown in phantom) if a three-phase detector is desired) and an additional reference circuit 16a. Additional input circuits and reference circuits or reference scaling can be added for higher order poly-phase operation.

As shown in FIG. 2, input circuit 14a receives input 20a and outputs output 30a (and input circuit 14b, if provided, receives input 20b and outputs output 30b). Preferably, input circuits 14, 14a (and 14b if provided) are "full wave". However, both the input circuits and the reference circuit can be provided as being "half wave", and may be provided as shown in FIG. 3.

In FIG. 2, the second differential input circuit 14a receives input 20a and produces a second output 30a that is summed with output 30 (and with output 30b, if input circuit 14b is provided). The composite output 30+30a (or 30+30a+30b, if input circuit 14b is provided) is compared with the reference current 50 in the comparator 52 and is filtered by filter 66. In the event that the inputs 20 and 20a (and 20b if input circuit 14b is provided) are sinusoidal and have a relationship in phase such that 20 and 20a (and 20b, if reference circuit 14b is provided) are 90 degrees apart, the identity sin squared plus cosine squared equals one can be applied. In this case, the reference will now represent the peak of the poly-phase source 20,20a (or 20, 20a and 20b, if input circuit 14b is provided) without scaling. This configuration or the logical extension of it represents a poly-phase signal amplitude comparator. The second reference circuit 16a provides reference output 50a from input 32a. In such case, the reference 50+50a and signal 30+30a will be compared in a single comparison circuit 52 and will be filtered by 66. By logical extension, the third input circuit 14b and reference 16b (both of which are shown in phantom in FIG. 2) can be added, and a three-phase detector is the result. If the reference is a direct current voltage, the multiple reference circuits can be combined in the poly-phase case to give a single appropriately scaled reference circuit.

While embodiments of the present invention are shown and described, it is envisioned that those skilled in the art may devise various modifications of the present invention without departing from the spirit and scope of the appended claims.

What is claimed is:

1. A signal amplitude comparator configured to receive an input voltage and a reference input voltage and is configured to generate an output which indicates whether the input voltage exceeds a pre-determined threshold value, said signal amplitude comparator comprising a first differential input circuit that is biased, is configured to receive the input voltage, and is configured to generate a first output current that is a non-linear function of the input voltage, a second differential input circuit which is biased similarly to the first differential input circuit, is configured to receive the reference input voltage, and is configured to generate a second output current that generally tracks process, temperature and supply variation, and a comparator which is connected to the first differential input circuit and the second differential input circuit and is configured to receive the first output current from the first differential input circuit and the second output current from the second differential input circuit, said comparator configured to compare the first and second output currents and generate the output which indicates whether said input voltage exceeds the pre-determined threshold value.

2. A signal amplitude comparator as claimed in claim 1, further comprising a filter connected to said comparator and configured to filter the first and second output currents.

3. A signal amplitude comparator as claimed in claim 1, wherein said first differential input circuit is configured to produce even order harmonic distortion over a pre-determined range of the input voltage.

4. A signal amplitude comparator as claimed in claim 1, wherein said first differential input circuit comprises a pair of input circuits, said pair of input circuits comprising a first transistor, a second transistor, a third transistor and a fourth transistor, said first and said third transistors forming an asymmetrical differential pair with the third transistor being biased so that said third transistor is in saturation for a range of signal levels.

5. A signal amplitude comparator as claimed in claim 4, wherein a ratio of said third transistor to said first transistor determines the non-linearity of the transfer function.

6. A signal amplitude comparator as claimed in claim 5, wherein the ratio of said third transistor to said first transistor is eight to one.

7. A signal amplitude comparator as claimed in claim 4, wherein said second transistor and said fourth transistor form a coupled pair with the fourth transistor being biased so that said fourth transistor is in saturation for a range of signal levels.

8. A signal amplitude comparator as claimed in claim 7, wherein said first transistor includes a drain and said second transistor includes a drain, said drain of said first transistor being connected to said drain of said second transistor thereby providing said first output current.

9. A signal amplitude comparator as claimed in claim 1, wherein said second differential input circuit comprises a pair of input circuits, said pair of input circuits comprising a first transistor, a second transistor, a third transistor and a fourth transistor, said first and said third transistors forming an asymmetrical differential pair with the third transistor being biased so that said third transistor is in saturation for a range of signals levels.

10. A signal amplitude comparator as claimed in claim 9, wherein said second transistor and said fourth transistor form a coupled pair with the fourth transistor being biased so that said fourth transistor is in saturation for a range of signal levels.

11. A signal amplitude comparator as claimed in claim 10, wherein said first transistor includes a drain and said second transistor includes a drain said drain of said first transistor being connected to said drain of said second transistor thereby providing said second output current.

12. A signal amplitude comparator as claimed in claim 1, wherein said first differential input circuit comprises a pair of input circuits, said pair of input circuits comprising a first transistor, a second transistor, a third transistor and a fourth transistor, said first and said third transistors forming an asymmetrical differential pair with the third transistor being biased so that said third transistor is in saturation for a range of signal levels, wherein said second differential input circuit comprises a pair of input circuits, said pair of input circuits comprising a fifth transistor, a sixth transistor, a seventh transistor and an eighth transistor, said fifth and said seventh transistors forming an asymmetrical differential pair with the seventh transistor being biased so that said seventh transistor is in saturation for a range of signal levels.

13. A signal amplitude comparator as claimed in claim 12, wherein said second transistor and said fourth transistor form a coupled pair with the fourth transistor being biased so that said fourth transistor is in saturation for a range of signal levels, wherein said sixth transistor and said eighth transistor form a coupled pair with the eighth transistor being biased so that said eighth transistor is in saturation for a range of signal levels.

14. A signal amplitude comparator as claimed in claim 13, wherein said first transistor includes a drain and said second transistor includes a drain, said drain of said first transistor being connected to said drain of said second transistor thereby providing said first output current, wherein said fifth transistor includes a drain and said sixth transistor includes a drain, said drain of said fifth transistor being connected to said drain of said sixth transistor thereby providing said second output current.

15. A poly-phase signal amplitude comparator configured to receive a poly-phase input source and at least one reference input voltage and is configured to generate an output which indicates whether the amplitude of the poly-phase input source exceeds a pre-determined threshold value, said signal amplitude comparator comprising a first differential input circuit that is biased, is configured to receive a first input voltage, and is configured to generate a first output current that is a non-linear function of the first input voltage, a second differential input circuit which is biased similarly to the first differential input circuit, is configured to receive a second input voltage, and is configured to generate a second output current that is a non-linear function of the second input voltage, and a comparator which is connected to the first differential input circuit and the second differential input circuit and is configured to receive the first output current from the first differential input circuit, the second output current from the second differential input circuit, and the at least one reference input voltage, said comparator configured to compare the sum of first and second output currents with the at least one reference input voltage and generate the output which indicates whether the amplitude of the poly-phase input source exceeds the pre-determined threshold value.

16. A poly-phase signal amplitude comparator as claimed in claim 15, wherein the poly-phase signal amplitude comparator is a three phase detector and includes a third a differential input circuit that is biased, is configured to receive a third input voltage, and is configured to generate a third output current that is a non-linear function of the third input voltage, wherein said comparator is connected to the third differential input circuit and is configured to receive the third output current therefrom, said comparator configured to compare the first, second and third output currents and generate the output which indicates whether the amplitude of the poly-phase input source exceeds the pre-determined threshold value.

17. A poly-phase signal amplitude comparator as claimed in claim 15, wherein said first and second differential input circuits are half wave circuits.

18. A poly-phase signal amplitude comparator as claimed in claim 15, wherein said first and second differential input circuits are full wave circuits.

19. A poly-phase signal amplitude comparator configured to receive a poly-phase input source and at least one reference input voltage and is configured to generate an output which indicates whether the amplitude of the poly-phase input source exceeds a pre-determined threshold value, said signal amplitude comparator comprising at least two differential input circuits that are biased, are configured to receive input voltages, and are configured to generate output currents that are a non-linear function of the input voltages, at least one reference circuit which is configured to receive the at least one reference input voltage and generate an output, and a comparator which is connected to the differential input circuits and the at least one reference circuit and is configured to receive the output currents from the differential input circuits and the output of the reference circuit, said comparator configured to compare the sum of the output currents with the output of the reference circuit and generate the output which indicates whether the amplitude of the poly-phase input source fixers the pre-determined threshold value.

20. A poly-phase signal amplitude comparator as claimed in claim 19, wherein the poly-phase signal amplitude comparator includes a plurality of reference circuits which generate a plurality of outputs, said outputs of said reference circuits being received by said comparator and compared to the sum of the output currents from the differential input circuits to determine whether the amplitude of the poly-phase input source exceeds the pre-determined threshold value.

* * * * *